(12) United States Patent
Nishi et al.

(10) Patent No.: US 10,170,348 B2
(45) Date of Patent: Jan. 1, 2019

(54) PRODUCTION SYSTEM FOR PRINTING ELECTRONIC DEVICES

(71) Applicants: Konica Minolta, Inc., Tokyo (JP); Ricoh Company, Ltd., Tokyo (JP); Toppan Printing Co., Ltd., Tokyo (JP)

(72) Inventors: Shinichi Nishi, Hachioji (JP); Hitoshi Kondoh, Tokyo (JP); Osamu Kina, Tokyo (JP)

(73) Assignees: KONICA MINOLTA, INC., Tokyo (JP); RICOH COMPANY, LTD., Tokyo (JP); TOPPAN PRINTING CO., LTD., Tokyo (JP)

( * ) Notice: Subject to any disclaimer, the term of this patent is extended or adjusted under 35 U.S.C. 154(b) by 262 days.

(21) Appl. No.: 15/107,338

(22) PCT Filed: Dec. 22, 2014

(86) PCT No.: PCT/JP2014/084001
§ 371 (c)(1),
(2) Date: Jun. 22, 2016

(87) PCT Pub. No.: WO2015/098892
PCT Pub. Date: Jul. 2, 2015

(65) Prior Publication Data
US 2017/0004985 A1    Jan. 5, 2017

(30) Foreign Application Priority Data
Dec. 26, 2013  (JP) .................................. 2013-270072

(51) Int. Cl.
*H01L 21/67*    (2006.01)
*H01L 51/00*    (2006.01)
(Continued)

(52) U.S. Cl.
CPC .. *H01L 21/67161* (2013.01); *H01L 21/67017* (2013.01); *H01L 21/67173* (2013.01);
(Continued)

(58) Field of Classification Search
CPC ......... H01L 21/67161; H01L 21/67167; H01L 21/67742; H01L 21/67017;
(Continued)

(56) References Cited

U.S. PATENT DOCUMENTS 5,876,280 A * 3/1999 Kitano .................. G03F 7/7075
355/27
9,943,969 B2 * 4/2018 Barker ................. B25J 19/0058
(Continued)

FOREIGN PATENT DOCUMENTS

| JP | 10-22358 A | 1/1998 |
|---|---|---|
| JP | 2000015198 A | 1/2000 |
| JP | 200082731 A | 3/2000 |
| JP | 2011257018 A | 12/2011 |
| WO | 2007088768 A1 | 8/2007 |

OTHER PUBLICATIONS

International Search Report dated Apr. 7, 2015 for PCT/JP2014/084001.

*Primary Examiner* — Glenn F Myers
(74) *Attorney, Agent, or Firm* — Lucas & Mercanti, LLP

(57) ABSTRACT

A printing production line system for an electronic device includes a transport chamber with a robot transport line in which a self-traveling robot transports a base material in a sheet-fed manner in a free state, a plurality of processing chambers for forming an electronic device on the base material by printing on at least one side of the transport chamber, and base material transfer areas that performs loading of the base material to the processing chambers from the self-traveling robot and unloading of the base material to the self-traveling robot from the processing chambers. The transport chamber and the base material transfer area com- (Continued)

municate with each other through respective openings, and a one-way air flow in each of the openings is formed by making an adjustment such that air pressure in the transport chamber is higher than air pressure in the base material transfer areas.

11 Claims, 6 Drawing Sheets

(51) Int. Cl.
*H01L 21/677* (2006.01)
*H01L 51/56* (2006.01)

(52) U.S. Cl.
CPC .... *H01L 21/67742* (2013.01); *H01L 51/0002* (2013.01); *H01L 51/0005* (2013.01); *H01L 51/56* (2013.01)

(58) Field of Classification Search
CPC .......... H01L 21/67173; H01L 21/6719; H01L 51/0005; H01L 51/0002; H01L 51/56; H01L 51/0003
See application file for complete search history.

(56) References Cited

U.S. PATENT DOCUMENTS

| | | | |
|---|---|---|---|
| 2001/0002858 A1* | 6/2001 | Kageyama | G02F 1/133305 349/158 |
| 2002/0020344 A1* | 2/2002 | Takano | H01L 21/67017 118/100 |
| 2002/0081962 A1* | 6/2002 | Matsuura | F24F 3/161 454/187 |
| 2006/0204356 A1* | 9/2006 | Yamagishi | H01L 21/67017 414/749.1 |
| 2007/0026151 A1* | 2/2007 | Higginson | H01L 21/67161 427/255.5 |
| 2008/0053957 A1* | 3/2008 | Wakabayashi | H01L 21/32137 216/67 |
| 2008/0298933 A1* | 12/2008 | Hsiao | H01L 21/67017 414/172 |
| 2010/0202093 A1* | 8/2010 | Yamawaku | H01L 21/67196 361/213 |
| 2012/0160353 A1* | 6/2012 | Konishi | H01L 21/67017 137/596 |
| 2013/0302115 A1* | 11/2013 | Wakabayashi | H01L 21/67196 414/217 |

* cited by examiner

PRODUCTION SYSTEM FOR PRINTING ELECTRONIC DEVICES

CROSS REFERENCE TO RELATED APPLICATION

This Application is a 371 of PCT/JP2014/084001 filed on Dec. 22, 2014, which, in turn, claimed the priority of Japanese Patent Application No. JP2013-270072 filed on Dec. 26, 2013, both applications are incorporated herein by reference.

TECHNICAL FIELD

The present invention relates to printing production systems for electronic devices and, more particularly, to a printing production system for so-called printed electronics which produces an electronic device by printing.

BACKGROUND

With the widespread use of information terminals, the need for flat panel displays as displays for computers has grown. Moreover, with the development of computerization, the number of occasions where information, which has been offered in the form of paper media in the past, is converted into electronic form is increased, and there is also a growing need for electronic paper or digital paper as a mobile display medium which is thin and light and allows it to be carried around easily.

In general, in flat-shaped display devices, a display medium is formed by using elements utilizing liquid crystal, organic EL (organic electroluminescence), electrophoresis, and the like. Moreover, in such a display medium, in order to ensure the uniformity in screen brightness, a screen rewriting speed, and so forth, the technology using active driving elements (TFT elements) as image driving elements has become the mainstream. For example, in an ordinary computer display, these TFT elements are formed on a glass substrate and the liquid crystal, the organic EL element, and so forth are encapsulated.

Here, in the TFT element, semiconductors such as a-Si (amorphous silicon), p-Si (polysilicon), and the like are mainly used, and these Si semiconductors (and metal films, if necessary) are stacked in layers and source, drain, and gate electrodes are sequentially formed on the substrate, whereby the TFT element is produced. For the production of such a TFT element, it is generally considered that high-temperature or high-vacuum production processes such as sputtering, plasma CVD, and photolithography are necessary.

Since the above-described existing formation of the TFT element using the Si materials includes a process which is performed at high temperature, the constraint that a substrate material is a material which endures the process temperature is sometimes added to the substrate material. Therefore, in actuality, a substrate, such as glass, which has high resistance to heat, plasma, and light has to be used, and, if a thin display such as the electronic paper or digital paper described above is configured by using such a known TFT element, the display becomes a product which is heavy, lacks in flexibility, and may be broken by a drop impact.

These characteristics caused by the formation of the TFT element on the glass substrate are undesirable in filling the need for an easy-to-use portable thin display, the need which arises with the development of computerization.

On the other hand, in recent years, as organic compounds having high charge transport capability, a study of organic semiconductor materials has been conducted intensively. An attempt has been made to apply these compounds to an organic laser oscillation element and an organic thin-film transistor element (organic TFT element) in addition to a charge transport material for an organic EL element.

Producing an organic thin-film transistor element by an inkjet method by turning an organic semiconductor material into ink as a solution has also been studied (Patent Document 1).

In the past, a printing production line system for an electronic device, the printing production line system which produces an electronic device such as an organic thin-film transistor element by using a printing method, has not been fully established.

Patent Document 2 discloses the technique of providing one processing chamber for a robot transport chamber.

However, this technique is a so-called one-to-one processing technique with a 1-to-1 transport chamber-to-processing chamber ratio and has no technical idea of a printing production line.

Therefore, a printing production line system for an electronic device is not disclosed at all in Patent Document 2 and it can be said that Patent Document 2 is an existing example in which the printing production line system is not fully established.

Patent Document 3 discloses that a transport container such as a FOUP is used when wafers are transported. Moreover, in paragraph 0011, Patent Document 3 makes the following disclosure "wafers are housed in a transport container such as a FOUP (Front-Opening Unified Pod) and transported in a facility in a hermetically sealed state. For this reason, a transport chamber with a high level of cleanliness is not provided, . . . ". This technique of Patent Document 3 is a so-called 1-to-n processing technique with a 1-to-n transport chamber-to-processing chamber ratio.

In the technique of Patent Document 3, a base material such as a wafer is transported to a processing chamber in a state in which the base material is housed in a hermetically sealed container, which is opened in the processing chamber and processing is performed, and, after being processed, the base material is hermetically sealed and transported to a processing chamber in a different location.

However, although the technique of transporting a base material to a processing chamber in state in which the base material is housed in a hermetically sealed container is considered to be capable of contributing to prevention of the occurrence of defective products caused by dust in the course of transport of a substrate to a processing chamber from a transport chamber, this technique has the drawback of the necessity for an operation to open the hermetically sealed container in the processing chamber and a resultant increase in the number of man-hours on a production line. Moreover, when the base material is transported to another processing chamber after being processed, an operation to house the base material in the hermetically sealed container again becomes necessary and this operation itself to hermetically seal the base material undesirably increases the number of man-hours.

As described above, the technique of Patent Document 3 undesirably increases the number of production man-hours and therefore cannot be applied to a printing production line for an electronic device, the printing production line which is required to have high productivity.

PRIOR ART DOCUMENTS

Patent Documents

Patent Document 1: WO 2007/088768
Patent Document 2: JP-A-2000-15198
Patent Document 3: JP-A-2011-257018

SUMMARY OF THE INVENTION

Problem to be Solved by the Invention

In view of those described above, an object of the present invention is to provide a printing production line system for an electronic device, the printing production line system that can achieve prevention of defective products caused by dust generated by a printing method and increase electronic device productivity.

The other problems of the present invention is disclosed by the following mentions.

Means for Solving Problem

The problem mentioned above is solved by the following aspects of the invention.

1. A printing production system for an electronic device, wherein
a transport chamber provided with a robot transport line in which a self-traveling robot that transports a base material in a sheet-fed manner in a free state travels is provided,
a plurality of processing chambers for forming an electronic device on the base material by printing are provided on at least one side of the transport chamber,
a base material transfer area that performs loading of the base material to the processing chamber from the self-traveling robot and unloading of the base material to the self-traveling robot from the processing chamber is provided between the transport chamber and each processing chamber,
the transport chamber and the base material transfer area communicate with each other through an opening that allows loading and unloading of the base material to be performed, the opening in which a one-way air flow moving to a side where the processing chamber is located from a side where the transport chamber is located is formed, and
the one-way air flow in the opening is formed by making an adjustment such that an air pressure in the transport chamber becomes higher than an air pressure in the base material transfer area.

2. The printing production system for an electronic device according to 1, wherein
the opening has a minimum opening area that allows loading and unloading of the base material to be performed.

3. The printing production system for an electronic device according to 1 or 2, comprising:
a plurality of air supply ports in an upper part of the transport chamber,
wherein
each air supply port is provided with a clean unit formed of a fan and a filter.

4. The printing production system for an electronic device according to any one of 1 to 3, comprising:
a straightening vane below the clean unit, the straightening vane for forming a wall parallel downward flow of clean air in the transport chamber.

5. The printing production system for an electronic device according to 4, wherein
the straightening vane is an inclined plate that spreads in a shape of an inverted V toward both wall surfaces of the transport chamber when viewed from a longitudinal direction of the transport chamber.

6. The printing production system for an electronic device according to any one of 1 to 5, wherein in an upper part of the base material transfer area or in each of the upper part of the base material transfer area and an upper part of the processing chamber, an air supply port that supplies clean air is provided.

7. The printing production system for an electronic device according to any one of 1 to 6, wherein
an exhaust port is provided in the processing chamber.

8. The printing production system for an electronic device according to any one of 1 to 7, wherein
the robot transport line is provided linearly in a longitudinal direction on a floor surface of the transport chamber.

9. The printing production system for an electronic device according to any one of 1 to 8, wherein
in each processing chamber, a processing apparatus is provided, and
as the processing apparatus, a cleaning apparatus, a printing apparatus, and a heating processing apparatus are provided.

10. The printing production system for an electronic device according to any one of 1 to 8, wherein
the base material is a film base material.

11. The printing production system for an electronic device according to any one of 1 to 10, wherein
the transport chamber, a plurality of base material transfer areas, and the plurality of processing chambers, each being provided so as to connect to a corresponding one of the plurality of base material transfer areas, are housed in a clean room, and
as for air cleanliness, which is air cleanliness conforming to FED-STD-209E which was cancelled in November, 2001, of the transport chamber, the plurality of base material transfer areas, the plurality of processing chambers, and the clean room, air cleanliness of the clean room is kept at Class 1000, air cleanliness of all the base material transfer areas and the plurality of processing chambers, each being provided so as to connect to a corresponding one of the plurality of base material transfer areas, is kept at Class 100, and air cleanliness of the transport chamber is kept at Class 10.

12. The printing production system for an electronic device according to 11, wherein
an air pressure $P_1$ in the clean room, an air pressure $P_2$ in the base material transfer area, and an air pressure $P_3$ in the transport chamber satisfy a relationship: $P_1<P_2<P_3$.

DESCRIPTION OF THE PREFERRED EMBODIMENTS

Hereinafter, a mode for carrying out the present invention will be described with reference to the drawings.

Figure 1:
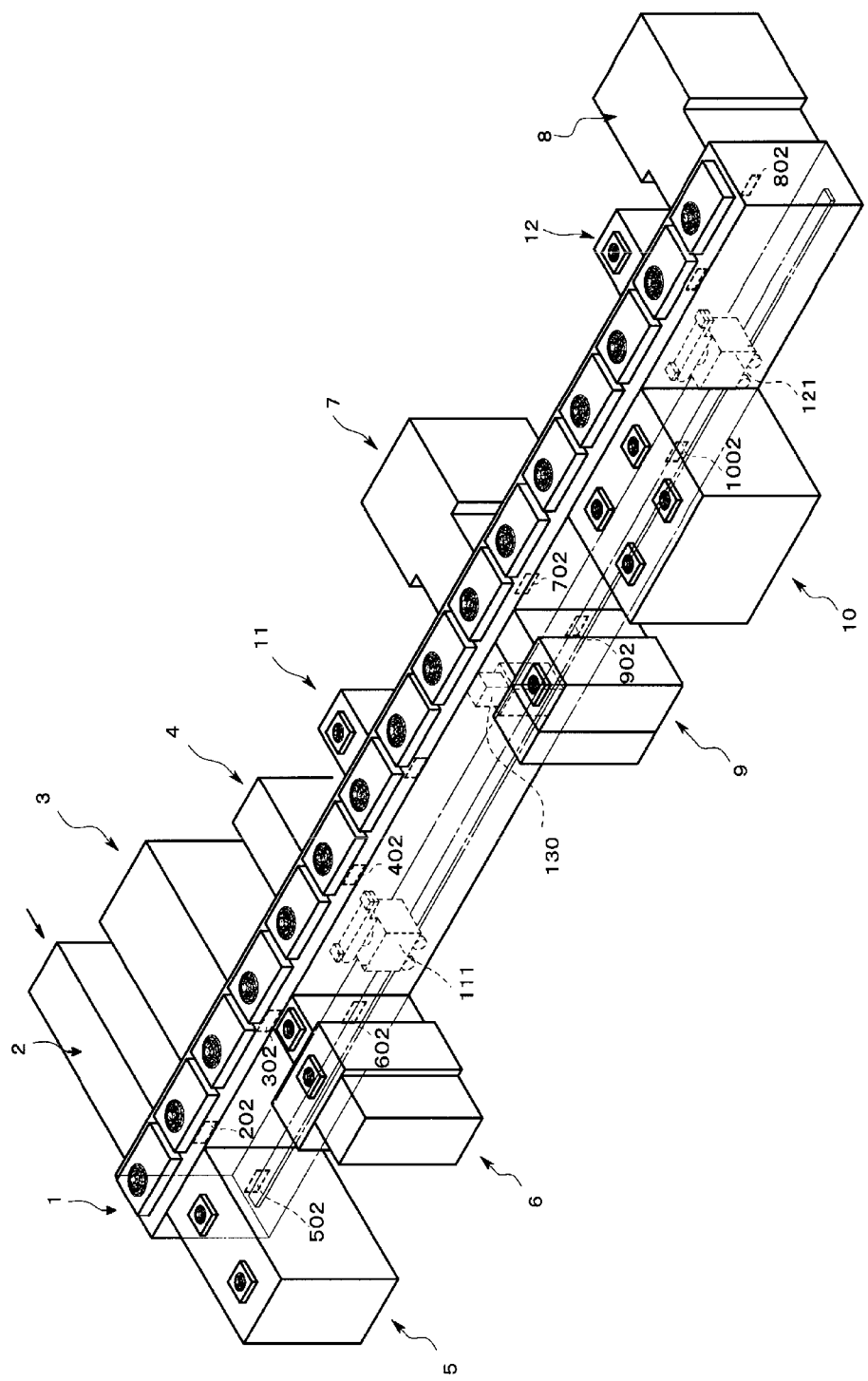
FIG. 1 is a schematic perspective view depicting an example of a printing production system for an electronic device according to the present invention.
Figure 2:
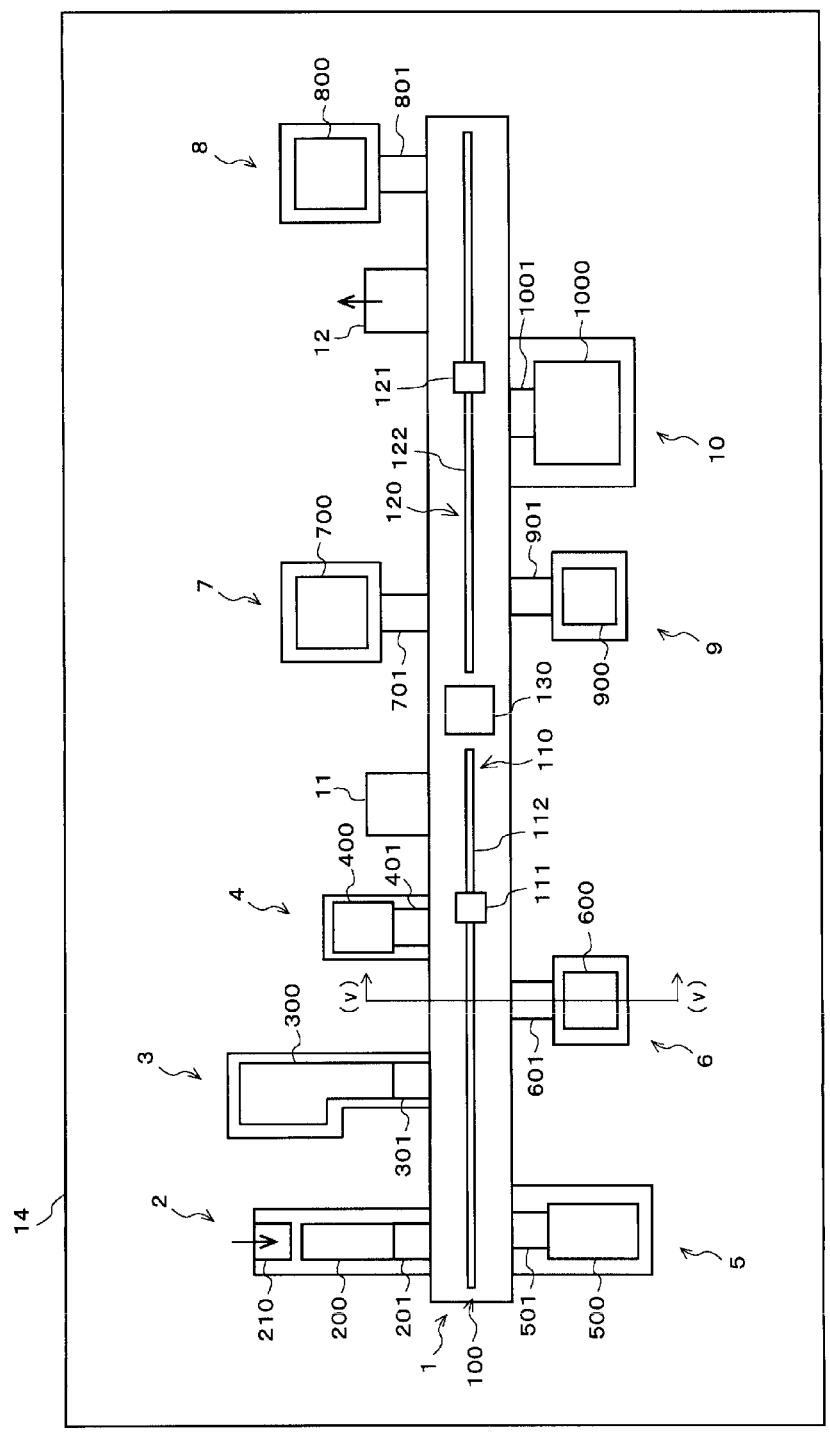
FIG. 2 is a schematic plan view depicting the example of the printing production system for an electronic device according to the present invention.

FIG. 1 is a schematic perspective view depicting an example of a printing production system for an electronic device according to the present invention and FIG. 2 is a schematic plan view depicting the example of the printing production system for an electronic device according to the present invention.

In FIGS. 1 and 2, 1 denotes a transport chamber and, in the transport chamber 1, a robot transport line 100 is provided. 2 to 10 each denote a processing chamber. In these processing chambers 2 to 10, processing apparatuses 200, 300, 400, 500, 600, 700, 800, 900, and 1000 which perform processing for forming an electronic device on a base material by printing are respectively provided.

The plurality of processing chambers 2 to 10 are provided on at least one side of the transport chamber 1. Here, "at least one side" means that the processing chambers 2 to 10 may be provided on one side, on the other side, on both sides, or on the upper side of the transport chamber 1.

The printing production system according to the present invention can be installed in a room with a high level of cleanliness such as a clean room 14. The clean room 14 is not limited to a particular room and may be a room whose all sides are defined by wall surfaces which prevent dust from entering the room from outside, and it is also desirable to add a method of providing further separation by using a resin sheet, glass, or the like on the inner surfaces of the wall surfaces.

In the transport chamber 1, the robot transport line 100 is provided, and this robot transport line 100 is formed of two transport lines 110 and 120.

The example depicted in the drawings illustrates a case where the robot transport line 100 is formed of two transport lines, but the robot transport line 100 may be formed of one or three or more transport lines.

The transport line 110 in the front stage is provided with one self-traveling robot 111 that transports a base material in a sheet-fed manner in a free state. Here, a free state means that, unlike Patent Document 3, when a base is transported in the transport chamber, the base is not housed in a hermetically sealed container.

In the present invention, when a base material is transported, it is not necessary to transport the base material in a hermetically sealed container such as a FOUP. This is because the transport chamber for the base material keeps a high level of cleanliness. The use of a hermetically sealed container is not desirable because this becomes a cause of impairment of the base material transport efficiency and increases the number of man-hours in line production of the electronic device. That is, by not using the hermetically sealed container, the transport efficiency at the time of performing complicated transport such as transporting a plurality of base materials to different processing chambers can be improved.

The self-traveling robot 111 is configured so as to be capable of transporting a base material on the transport line 110 by reciprocating along a guide rail 112 with the base material placed on the self-traveling robot 111. In the example depicted in the drawings, the guide rail 112 is a linear guide rail having no branch and is installed on the floor surface of the transport chamber 1.

As is the case with the transport line 110, the transport line 120 is also provided with one self-traveling robot 121 that transports a base material in a sheet-fed manner. The self-traveling robot 121 can reciprocate along a linear guide rail 122 having no branch.

In the example depicted in the drawings, such a guide rail 112 and the above-described guide rail 122 are not connected to each other and are provided separately.

130 denotes a through loader. The through loader 130 is configured so as to be capable of placing a plurality of base materials thereon. In the example depicted in the drawings, the through loader 130 is provided between the guide rail 112 and the guide rail 122. The self-traveling robot 111 of the transport line 110 can place a base material on the through loader 130 and the self-traveling robot 121 of the transport line 120 can receive the base material placed on the through loader 130. Conversely, it is also possible to transfer a base material to the self-traveling robot 111 of the transport line 110 from the self-traveling robot 121 of the transport line 120 via the through loader 130.

This makes it possible to transport the base material between the transport line 110 and the transport line 120.

In the example depicted in the drawings, as a result of the transport lines 110 and 120 being connected in series via the through loader 130, the transport lines 110 and 120 form the robot transport line 100.

When the robot transport line 100 is formed of a plurality of transport lines, the linear transport line 110 and the linear transport line 120 may be disposed such that the transport lines 110 and 120 form a right angle, for example. Moreover, the linear transport line 110 and the linear transport line 120 may be disposed hierarchically.

In the above-described example, the placement of the plurality of linear transport lines has been described, but the example is not limited thereto, and each transport line may be an arc-shaped transport line.

The base material is transported to the insides of the processing chambers 2 to 10 by the self-traveling robots 111 and 121 and processed by the processing apparatuses 200, 300, 400, 500, 600, 700, 800, 900, and 1000.

Of these processing chambers, the processing chambers 2, 3, 4, 5, and 6 (the processing apparatuses 200, 300, 400, 500, and 600) are provided on both sides of the transport chamber 1 provided with the transport line 110. Moreover, the other processing chambers 7, 8, 9, and 10 (the processing apparatuses 700, 800, 900, and 1000) are provided on both sides of the transport chamber 1 provided with the transport line 120.

Each processing chamber is provided with the following processing apparatus. The processing chamber 2 is provided with a cleaning processing apparatus 200 that performs base material cleaning processing, and an example of the cleaning processing apparatus 200 includes, for example, a cleaning processing apparatus formed of a wet cleaning machine that cleans the base material with a liquid containing a surface-active agent and then rinses the base material and a UV-ozone cleaning machine that performs UV-ozone cleaning on the base material cleaned by the wet cleaning machine.

The processing chamber 3 is provided with a printing processing apparatus 300 that forms an electrode. Examples of the printing processing apparatus 300 include a reverse printing machine and the like.

The processing chamber 4 is provided with a cleaning processing apparatus 400 that performs electrode cleaning. Examples of the cleaning processing apparatus 400 include a wet cleaning machine and the like.

The processing chamber 5 is provided with a printing processing apparatus 500 that performs slit die coating printing. Examples of the printing processing apparatus 500 include, for example, a slit die coater that performs slit die coating printing on the base material.

The processing chamber 6 is provided with a heating processing apparatus 600 that performs heating processing. Examples of the heating processing apparatus 600 include, for example, a heating baking furnace (an oven) that is capable of performing heating baking the material added to the surface of the base material.

The processing chamber 7 is provided with a printing processing apparatus 700 that performs screen printing processing. Examples of the printing processing apparatus 700 include, for example, a first screen printing machine that performs screen printing (a pixel electrode which will be described later) on the base material.

The processing chamber 8 is provided with a printing processing apparatus 800 that performs screen printing processing. Examples of the printing processing apparatus 800 include, for example, a second screen printing machine that performs screen printing (an intermediate layer) on the base material.

The processing chamber 9 is provided with a heating processing apparatus 900 that performs heating processing. Examples of the heating processing apparatus 900 include, for example, a heating baking furnace (an oven) that performs heating baking the material printed on the base material.

The processing chamber 10 is provided with a printing processing apparatus 1000 that performs inkjet printing processing. Examples of the printing processing apparatus 1000 include, for example, an inkjet printing machine that performs inkjet printing on the base material.

In the example described above, the cleaning processing apparatus is provided in the processing chambers 2 and 4 and the configuration of the cleaning processing apparatus is not limited to a particular configuration; for example, one or two or more methods selected from a wet method such as shower cleaning or immersion cleaning using only a solvent or a solvent and a cleaning agent, a physical cleaning method such as brush cleaning or sponge cleaning, dry cleaning using UV-ozone or an air knife, and so forth can be combined and used.

When the wet method is used, it is desirable to perform rinsing using a shower and drying; preferred examples of a drying method include air knife drying, infrared drying, far infrared drying, and UV light drying and one or two or more of these methods can be combined and used.

The solvent which is used at the time of cleaning by the wet method is not limited to a particular solvent, and methyl alcohol, ethyl alcohol, propyl alcohol, acetone, methyl ethyl ketone, or the like can be used.

The cleaning processing apparatuses of the processing chambers 2 and 4 may be identical with each other or different from each other.

In the above-described example, the printing processing apparatus is provided in the processing chambers 3, 5, 7, 8, and 10 and the configuration of the printing processing apparatus is not limited to a particular configuration; for example, preferred examples include printing machines that perform gravure offset, reverse printing, flexo printing, screen printing, and microcontact printing by using an intaglio plate, a letterpress plate, a stencil printing plate, and a planographic plate.

Furthermore, an inkjet printing machine can also be suitably used. The printing processing apparatuses of the processing chambers 3, 5, 7, 8, and 10 may be identical with one another or different from one another.

In the above-described example, the heating processing apparatus is provided in the processing chambers 6 and 9 and the configuration of the heating processing apparatus is not limited to a particular configuration; for example, preferred examples include, for example, a heating processing apparatus adopting a non-contact method such as an infrared hot-air drying furnace or a heating processing apparatus adopting a contact method such as a hot plate. Moreover, for example, when a UV curing printing film is formed on the base material, a light baking furnace can also be suitably used as the heating processing apparatus. The light baking furnace can also be suitably used when heating processing is performed by making the printing film on the base material absorb light and perform thermal conversion. The heating processing apparatuses of the processing chambers 6 and 9 may be identical with each other or different from each other.

In FIGS. 1 and 2, 11 and 12 each denote a stock chamber for temporarily stocking the base material and are provided adjacent to the transport chamber 1. For example, when processing such as printing is ended or temporarily suspended, the base material can be stocked in the stock chambers 11 and 12. Moreover, an openable and closable door (not depicted in the drawings) may be provided such that the base material stocked in the stock chambers 11 and 12 can be taken out to the outside. For example, the base material subjected to all the processing can be taken out to the outside via the stock chambers 11 and 12. In this embodiment, the base material subjected to all the processing is assumed to be taken out to the outside via the stock chamber 12. Furthermore, the base material in the course of processing can also be taken out to the outside via the stock chambers 11 and 12 for a defect inspection, short circuit repair, electrical characteristics measurement, and so forth. In addition, a base material from the outside can also be fed to the transport line 100 via the stock chambers 11 and 12.

Figure 3:
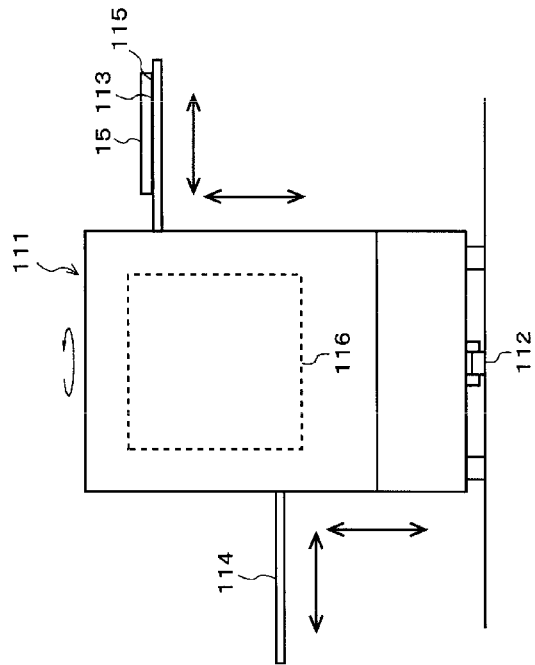
FIG. 3 is a schematic side view of a self-traveling robot.
Figure 4:
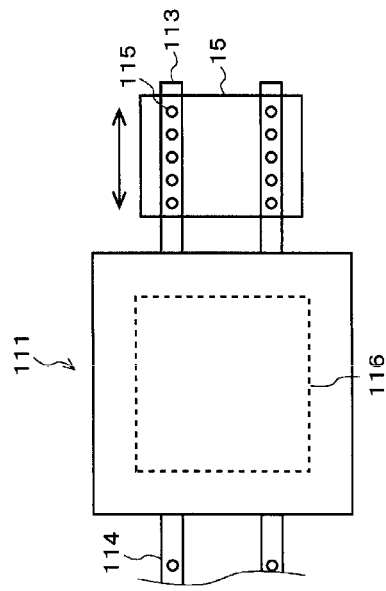
FIG. 4 is a schematic plan view of the self-traveling robot.

FIG. 3 is a schematic side view of the self-traveling robot 111 viewed from a direction along the guide rail 112 and FIG. 4 is a schematic plan view thereof.

The self-traveling robot 111 can have one or two or more arms that can move a base material 15 and it is desirable that, as depicted in the drawings, the self-traveling robot 111 has two arms 113 and 114. The specific configuration of the arms 113 and 114 is not limited to a particular configuration and any one of a configuration in which the arm moves with the base material 15 placed thereon, a configuration in which the arm moves with the base material 15 sandwiched therebetween, and so forth may be adopted. The example depicted in the drawings illustrates an example of the configuration in which each of the arms 113 and 114 moves with the base material 15 placed thereon. Here, it is desirable that, on a placement surface on which the base material 15 is to be placed, a suction mechanism 115 for making the base material 15 stick to the placement surface by suction is provided.

Each of the arms 113 and 114 is not limited to a particular arm and is configured so as to be capable of independently moving the base material 15 vertically and laterally. For example, it is possible to configure the arm 113 so as to be capable of moving the base material 15 to one side of the transport line 110 and configure the arm 114 so as to be capable of moving the base material 15 to the side opposite to the one side of the transport line 110.

Moreover, it is desirable that the self-traveling robot 111 is provided with a housing portion 116 in which a plurality of base materials 15 can be housed. This makes it possible to transport the plurality of base materials 15 along the transport line 110 at the same time.

The self-traveling robot 121 can also be configured in the same manner as the self-traveling robot 111 described above.

Transfer of the base material between the self-traveling robots 111 and 121 in the transport chamber 1 and the processing apparatuses 200, 300, 400, 500, 600, 700, 800, 900, and 1000 in the processing chambers 2 to 10 is performed via base material transfer areas 201, 301, 401, 501, 601, 701, 801, 901, and 1001 (refer to FIG. 2).

In the present invention, between the transport chamber 1 and the processing chambers 2 to 10, the base material transfer areas 201, 301, 401, 501, 601, 701, 801, 901, and 1001 are provided.

In the present invention, the base material transfer area may be provided separately from the processing chamber or may be located inside the processing chamber.

Figure 5:
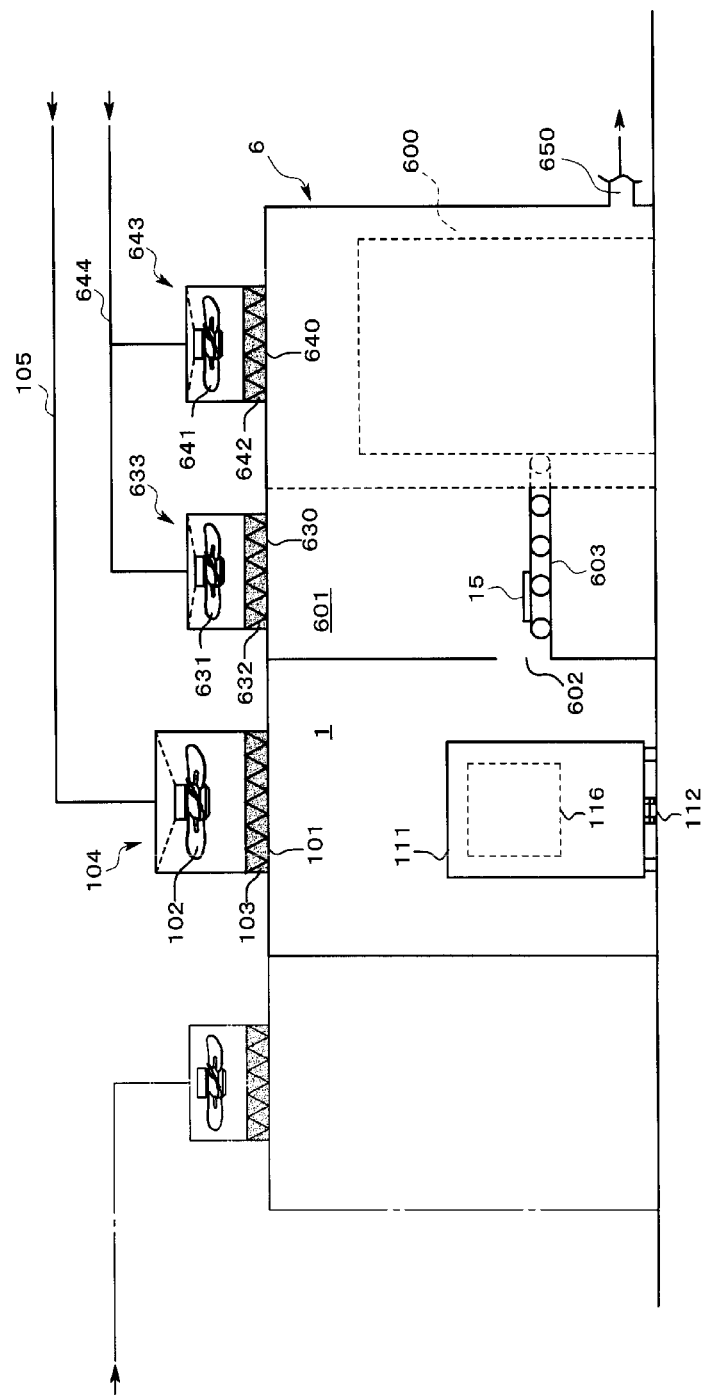
FIG. 5 is a schematic sectional view taken on the line (v)-(v) in FIG. 2.

FIG. 5 is a schematic sectional view taken on the line (v)-(v) in FIG. 2 and depicts an example of a base material transfer mechanism. This configuration is an example in which the base material transfer area is provided separately from the processing chamber.

In the present invention, in the base material transfer area, loading of the base material to each processing apparatus from the self-traveling robot and unloading of the base material to the self-traveling robot from the processing apparatus are performed.

Specifically, in the example of FIG. 5, loading of the base material 15 to the processing apparatus 600 in the processing chamber 6 from the self-traveling robot 111 and unloading of the base material 15 to the self-traveling robot 111 from the processing apparatus 600 are performed in the base material transfer area 601.

The following is the more detailed description of the above loading and unloading. Loading of the base material 15 to the processing apparatus 600 from the self-traveling robot 111 is performed as follows: the self-traveling robot 111 places a base material to be processed by the processing apparatus 600 on a transport conveyor 603 in the base material transfer area 601. The base material to be processed, the base material loaded on the transport conveyor 603, is taken out of the transport conveyor 603 and transferred to the processing apparatus 600.

Then, the base material is processed in the processing apparatus 600, and the processed base material is put back to the transport conveyor 603 in the base material transfer area 601. Unloading of the base material 15 to the self-traveling robot 111 from the processing apparatus 600 is dislodging of the processed base material from the base material transfer area 601 which is performed by the self-traveling robot 111.

This makes it possible for the self-traveling robot 111 to transport the base material to the next processing process.

Moreover, though not depicted in the drawing, in place of the transport conveyor, a multistage shelf or the like may be provided and the base materials may be sequentially placed on the multistage shelf by the arm of the self-traveling robot 111. A separate transport arm may be provided on the side where the processing apparatus is located and the base materials inside the multistage shelf may be transferred to the processing apparatus by being transported by that arm.

The transport chamber 1 and the base material transfer area 601 communicate with each other by an opening 602 that performs transfer of the base material and one-way circulation of air.

After moving to a predetermined position in the transport line 110 along the guide rail 112, the robot 111 places the base material 15 housed in the housing portion 116 on the transport conveyor 603, for example, in the base material transfer area 601 by using the arm 113 depicted in FIGS. 3 and 4 through the opening 602.

From the viewpoint of, for example, performing processing in the processing apparatus 600 with a high degree of precision, it is desirable to perform positioning of the base material 15 in the base material transfer area 601 in advance. Positioning can be performed by combining one or two or more of a method of performing positioning with reference to the outside shape of the base material 15, a method of reading an alignment mark provided on the base material 15 by printing with an automatic camera, and so forth.

The base material 15 subjected to predetermined processing in the processing apparatus 600 is put back to the transport conveyor 603 from the processing apparatus 600 in the above-described manner.

The robot 111 collects the base material placed on the transport conveyor 603, for example, through the opening 602 by using the arm 113 in the predetermined position in the transport line 100 and puts the base material back into the housing portion 116.

In the above description, transfer of the base material 15 between the self-traveling robot 111 and the processing apparatus 600 in the processing chamber 6 has been described, but the same configuration can be applied to the other processing apparatuses and the other self-traveling robot. It is desirable to perform computerized control of transport and transfer of the base material such that transport and transfer of the base material are performed automatically.

Next, the opening that makes the transport chamber and the base material transfer area communicate with each other will be described.

In the present invention, there is a need for a mouth of the opening 602 to allow loading and unloading of the base material 15 to be performed and the mouth of the opening 602 only has to be a mouth that allows such loading and unloading to be performed. When the base material is transported in a state in which the base material is fixed to the arm of the robot, it is desirable that the mouth of the opening 602 is a mouth that allows the base material to pass therethrough along with the arm.

Moreover, in the present invention, the air flow in the opening is controlled so as to be generated in one direction and is a one-way air flow whose direction is a direction to the side where the base material transfer area is located form the side where the transport chamber is located.

In the present invention, the one-way air flow is formed by adopting a configuration in which the air pressure in the transport chamber is regulated so as to be higher than the air pressure in the base material transfer area. In forming the above-described one-way air flow, in order to ensure that flow, it is important that, near the opening 602, the air pressure on the side where the transport chamber is located is higher than the air pressure on the side where the base material transfer area is located.

The air pressure in the transport chamber 1 is higher than the air pressure in each base material transfer area preferably in the 0.01-Pa to 10-Pa range and, more preferably, in the 0.5-Pa to 3-Pa range. For air pressure measurement, a gas pressure gauge that can measure the air pressure in the above-described ranges can be used.

As a result, dust is prevented from being carried into the transport chamber from the side where the base material transfer area is located and dust which is generated in connection with the processing in the processing chamber can also be prevented from being carried into the other processing chamber, whereby it is possible to prevent an unexpected defective product from being caused.

Moreover, by supplying clean air to the inside of the transport chamber 1 and keeping air cleanliness at a high level, the fear of contamination by the dust of the base material in the transport chamber 1 is eliminated. As a result, even when the base material is transported in the transport chamber 1 in a sheet-fed manner in a free state, it is possible to prevent adhesion of dust to the base material in the transport chamber 1.

In the preferred embodiment of the present invention, as depicted in FIG. 5, it is desirable that, in the upper part of the transport chamber 1, a plurality of air supply ports 101 are provided and each air supply port 101 is provided with a clean unit 104 formed of a fan 102 and a filter 103. 105 denotes an air supply pipe. As such a clean unit, a commercially available clean unit can be used.

In the present invention, forming a wall parallel downward flow 106 of clean air in the transport chamber is desirable in forming the one-way air flow moving toward the side where the base material transfer area is located from the side where the transport chamber is located. In forming the wall parallel downward flow 106, it is desirable that no obstacle that obstructs the air flow is present near the wall surface of the transport chamber. The reason is that this disturbs the air flow.

Figure 6:
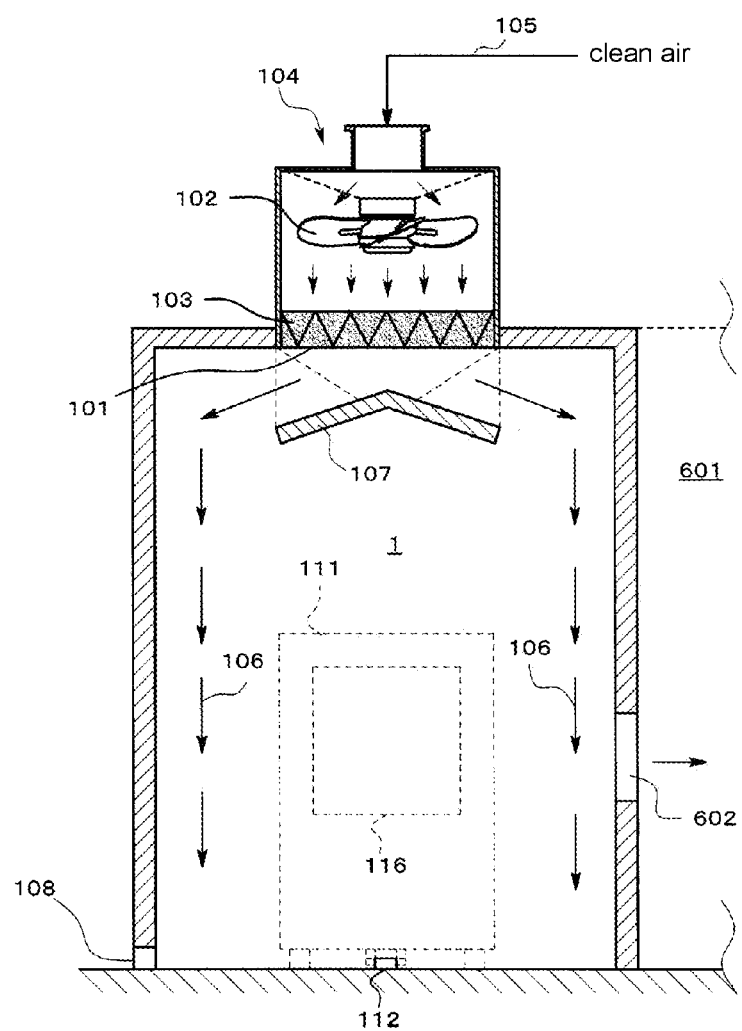
FIG. 6 is a diagram explaining the flow of clean air in a transport chamber of the printing production system for an electronic device depicted in FIG. 5.

Furthermore, as depicted in FIG. 6, it is desirable to provide, below the clean unit 104, a straightening vane 107 for forming the wall parallel downward flow 106 of clean air in the transport chamber 1. As such a straightening vane 107, an inclined plate that spreads in the shape of an inverted V toward both wall surfaces of the transport chamber 1 when viewed from the longitudinal direction of the transport chamber 1 can be used. When the clean air is blown onto the inclined plate 107 from the clean unit 104, the air that has hit the inclined plate 107 is separated into right and left, moves in the direction of the wall surfaces of the transport chamber 1, and moves downward by being straightened so as to move along the wall surfaces. In the course of downward movement, a one-way air flow moving toward the base material transfer area 601 from the transport chamber 1 is formed in the opening 602.

The clean air supplied to the transport chamber 1 from the supply port is sent to the base material transfer areas 201, 301, 401, 501, 601, 701, 801, 901, and 1001 through the openings 202, 302, 402, 502, 602, 702, 802, 902, and 1002. However, since the size of the mouth of each opening is a size that allows the base material to pass therethrough along with the robot arm, the size of the mouth is not so large. The opening has a minimum opening area that allows loading and unloading of the base material to be performed. Thus, of the clean air supplied to the transport chamber 1, excessive air that is not sent to the opening is exhausted to the clean room 14 through an exhaust slot 108 provided in a lower part of the transport chamber 1.

If the velocity of the wall parallel downward flow 106 of clean air is excessively high, there is a possibility that a vacuum phenomenon occurs in the opening 602. Thus, in order to form a one-way air flow moving toward the base material transfer area 601 from the transport chamber 1 without causing the occurrence of such a vacuum phenomenon, the velocity of flow of air in the openings 202, 302, 402, 502, 602, 702, 802, 902, and 1002 is preferably in the 0.1-m/sec to 3.0-m/sec range and, more preferably, in the 0.3-m/sec to 1.0-m/sec range.

Next, an air supply mode in the base material transfer area 601 and the processing chamber 6 will be described.

In the preferred embodiment depicted in FIG. 5, an air supply unit by which clean air is supplied is provided in both the base material transfer area 601 and the processing chamber 6.

In the base material transfer area 601, an air supply port 630 that supplies clean air to the upper part of the chamber 630 is provided. Moreover, in the upper part of the processing chamber 6, an air supply port 640 that supplies clean air is provided.

In the air supply port 630 in the base material transfer area 601, an air supply unit 633 formed of a fan 631 and a filter 632 is provided.

Furthermore, in the air supply port 640 of the processing chamber 6, an air supply unit 643 formed of a fan 641 and a filter 642 is provided.

In the present invention, the air which is supplied from the fan 631 and the fan 641 is supplied from clean air piping 644.

Each of the fan 102 of the transport chamber, the fan 631 in the base material transfer area, and the fan 641 of the processing chamber has fan specifications, and a fan having a predetermined discharge pressure is selected and used.

The clean air supplied to the inside of the transport chamber 1 through the air supply port 101 is introduced to the base material transfer area 601 through the opening 602. This clean air is exhausted from an exhaust port 650 with the mixed air generated by mixing dust generated from the processing apparatus 600 or the like into the clean air from the air supply port 630 provided in the upper part of the base material transfer area 601 and the clean air of the air supply port 640 provided in the upper part of the processing chamber 6.

Since the air flow is formed in one direction between the inside of the transport chamber 1 and the base material transfer area 601, it is desirable that the opening 602 keeps an open state at all times while the processes in the printing production system are being performed. This eliminates the need to perform complicated opening and closing control when, in particular, a plurality of base materials are processed concurrently on a production line, which makes it possible to implement easy control.

It goes without saying that a processing chamber having an opening and closing member such as a shutter or a door in an opening may be provided. The opening and closing member can be provided for the purpose of, for example, maintaining the humidity or temperature in the processing chamber (the processing apparatus) or preventing drying in the processing chamber (the processing apparatus). In particular, in the printing production system, it is also desirable to provide a processing chamber having an opening and closing member from the viewpoint of controlling the drying speed of ink or the like.

At this time, an adjustment is made such that the air pressure in the transport chamber 1 becomes higher than the air pressure in the base material transfer area in such a way that an air flow is formed in one direction even when the state is changed from a state in which the opening is closed by closing the opening and closing member to a state in which the opening and closing member is opened. This makes it possible to prevent defective products and the like which are caused by dust.

The above-described printing production system for an electronic device is disposed in the clean room 14 as described with reference to FIGS. 1 and 2. At this time, it is preferable that an air pressure $P_1$ in the clean room 14, an air pressure $P_2$ in the base material transfer area, and an air pressure $P_3$ in the transport chamber satisfy the relationship:

$P_1<P_2<P_3$. This makes it possible to transport the base material in a free state (a so-called bare state) without contaminating the inside of the transport chamber which is a large chamber and obtain the effect of more reliably achieving prevention of defective products caused by dust.

For example, if the dust generated from the processing chamber in which printing of a conductive material (an electrode) is performed adheres, via the transport chamber 1, to the base material in a stage in which an insulating material (an insulating layer) is printed thereon, there is a possibility that the insulating properties are affected. However, by making an adjustment such that the air pressure in the transport chamber 1 becomes higher than the air pressure in the base material transfer area, it is possible to prevent such a movement of dust from occurring.

As compared to a subtractive method (a method including a process of removing the added material) such as photolithography or laser ablation, the printing method can easily configure an additive method (a method which simply adds a material) and is advantageous in reducing the generation of dust. However, in the printing method, characteristic dust (for example, an ink mist containing a conductive material or an insulating material, solvent vapor which is generated from an oven, and so forth) is sometimes generated, and, since such dust is extremely minute, there is a possibility that the dust moves through air.

On the other hand, as described earlier, by making an adjustment such that the air pressure in the transport chamber 1 becomes higher than the air pressure in the base material transfer area 601 in such a way that an air flow is formed in one direction, it is possible to block suitably the air flow moving toward the transport chamber 1 from the processing chamber 6 together with the dust moving with the air flow and thereby prevent defective products and the like caused by the dust.

As described above, first, by automating the processes by performing transport by a robot when the base material is transported between a plurality of processing chambers, it is possible to increase electronic device productivity. In particular, by using a self-traveling robot as the robot, as compared to a fixed-type robot or the like, it is also possible to increase the flexibility of a transport range (a transport line) and enhance the scalability of a production line. Furthermore, by making an adjustment such that the air pressure in the transport chamber becomes higher than the air pressure in the base material transfer area in a state in which the transport chamber and the base material transfer area communicate with each other by the opening, it is possible to achieve prevention of defective products caused by dust which is generated by the printing method.

In the configuration of FIG. 5, a case where the air supply port is provided in the upper part of the base material transfer area and in the upper part of the processing chamber has been described, but the configuration is not limited thereto; the air supply port may be provided only in the upper part of the base material transfer area 601 or only in the upper part (a ceiling portion) in the processing chamber 6.

In the above description, the air cleaning mechanism for the processing chamber 6 has been mainly described, but the other processing chambers can also be configured in the same manner.

In the present invention, as air cleanliness, it is desirable to keep the inside of the clean room at Class 1000, all the base material transfer areas and the plurality of processing chambers, each being provided so as to connect to a corresponding one of the plurality of base material transfer areas, at Class 100, and the inside of the transport chamber at Class 10.

Incidentally, in the present specification, classification of air cleanliness conforms to FED-STD-209E (which was cancelled in November, 2001). As indicated in Table 1, FED-STD-209E defines the allowable number of dust particles per cubic feet of air for each particle size.

TABLE 1

| | Maximum Number of Airborne Dust/Cubic Feet | | | | |
|---|---|---|---|---|---|
| Class | 0.1 µm or greater | 0.2 µm or greater | 0.3 µm or greater | 0.5 µm or greater | 5 µm or greater |
| 1 | 35 | 7.5 | 3 | 1 | 0.007 |
| 10 | 350 | 75 | 30 | 10 | 0.07 |
| 100 | 3500 | 750 | 300 | 100 | 0.7 |
| 1000 | 35000 | 7500 | 3000 | 1000 | 7 |
| 10000 | 350000 | 75000 | 30000 | 10000 | 70 |
| 100000 | $3.5 \times 10^6$ | 750000 | 300000 | 100000 | 700 |

In the present invention, in the transport chamber, the robot transport line that transports the base material by the self-traveling robot is provided. Moreover, on one side, both sides, or the upper side of the transport chamber, the processing chambers provided with a plurality of processing apparatuses for forming an electronic device by printing are provided consecutively. Each processing apparatus itself is a large apparatus. Since a plurality of such processing apparatuses are provided on both sides, for example, of the transport chamber, it is also necessary to increase the planar length of the transport chamber. Since the robot transport line is provided inside and the self-traveling robot that transports the base material in a sheet-fed manner in a free state is provided on the robot transport line, the capacity of the transport chamber is also increased considerably. According to the preferred embodiment, the planar shape of the transport chamber in which the robot transport line is provided linearly is in the range of 20 to 25 mL×1.0 to 1.5 mW.

Since the base material is transported in a free state, that is, in a bare state, in the transport chamber having such a large capacity, it is desirable that the air cleanliness in the transport chamber is kept at about Class 10. It is not easy to keep the air cleanliness of a large chamber at about Class 10 at all times. Once a large chamber is contaminated, it takes considerable time and cost to restore the chamber to the clean state. If the processing is stopped, the production of an electronic device by printing has to be stopped, which results in a large loss.

As an electronic device in the present invention, preferred examples thereof include, for example, a device provided with a thin-film transistor or the like, and a device provided with an organic thin-film transistor using an organic semiconductor material in a semiconductor layer is particularly suitable. More specific examples of the electronic device include, for example, an organic thin-film transistor array (organic TFT array) in which a large number of organic thin-film transistors are arranged on a base material in a matrix.

Hereinafter, one embodiment of the present invention will be described in more detail by taking up, as an example, a case where an electronic device which is produced by the printing production system 1 is an organic thin-film transistor (pixel driving element) array depicted in FIG. 7.

Figure 7:
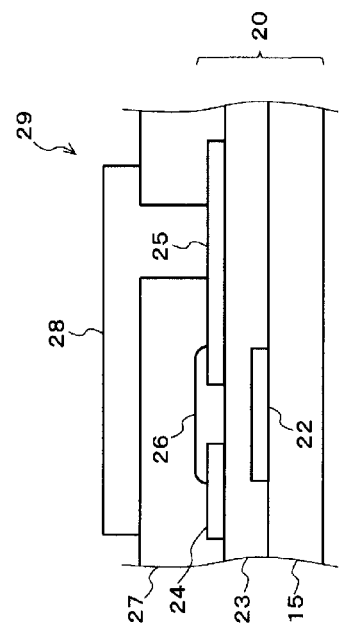
FIG. 7 is a diagram explaining an example of an organic thin-film transistor array.

FIG. 7 is a diagram explaining an example of an organic thin-film transistor array and is an enlarged sectional view of one organic thin-film transistor of a large number of organic thin-film transistors included in the array. An organic thin-film transistor 20 depicted in the drawing includes a gate electrode 22 on a base material 15 formed of a resin film, for example, a gate insulating layer 23 thereon, a source electrode 24 and a drain electrode 25 thereon, and an organic semiconductor layer 26 between the source electrode 24 and the drain electrode 25.

In the example depicted in the drawing, in addition to those described above, on the drain electrode 25 of the organic thin-film transistor 20, an intermediate layer 27 is provided, and, on the intermediate layer 27, an electrode (a pixel electrode) 28 connected to the drain electrode 25 via the intermediate layer 27 is further provided. In this way, it is possible to configure a pixel driving element 29 having the organic thin-film transistor 20 as a driving element.

The pixel electrode 28 of the pixel driving element 29 can be used to apply a driving voltage to each pixel in an image display device using organic EL, liquid crystal, electrophoresis, or the like.

By using the printing production system depicted in FIGS. 1 and 2, it is possible to configure processing processes which will be described below, for example. Here, a case where, as an example of the electronic device, the organic thin-film transistor (pixel driving element) array depicted in FIG. 7 is formed is described.

First, a base material 15 on which an organic thin-film transistor (pixel driving element) array is to be formed is prepared.

The base material 15 is not limited to a particular base material and may be any one of a relatively hard and high heat-resistance base material such as a glass base material, a ceramic base material, or a metal base material (for example, a metal thin-film base material), a base material formed of a mixture of two types of materials, such as a paper phenol base material, paper epoxy base material, a glass composite base material, or a glass epoxy base material, and a resin base material, and it is more preferable that the base material 15 is a resin base material (for example, a resin film). This makes it possible to implement a flexible electronic device suitably. The base material 15 may have a single-layer structure or a multilayer structure. Moreover, the shape of the base material 15 is not limited to a particular shape, but a film-shaped base material 15 is preferable.

The material of the resin film (hereinafter sometimes referred to as a film base material) is not limited to a particular material and preferred examples thereof include polyethylene naphthalate (PEN), polyimide (PI), polycarbonate (PC), and polyethylene terephthalate (PET).

When a highly flexible base material or a base material which is easily deformable depending on the temperature, for example, like the film base material, is used as the base material, it is desirable to fix the base material detachably to a supporting member as appropriate. The supporting member is not limited to a particular supporting member as long as the supporting member can support the base material, but it is desirable to use, for example, a base material made of a harder material, such as a glass base material, compared to the film base material. For example, it is desirable that the film base material is attached (bonded) to the surface of the glass base material which is the supporting member, transported in this state, and subjected to each processing in this state.

For instance, when the film base material is attached to the surface of the glass base material, attaching the film base material to the surface of the glass base material by stacking the film base material on the glass base material with a sheet-like, liquid, or gel-like adhesive placed therebetween and applying heat or pressure is preferable because this makes it possible to improve the positional precision of an electronic device to be produced. It is desirable that the above adhesive is an adhesive that allows the film base material to be easily detached (debonded) from the surface of the glass base material by cooling, irradiation with light, or the like after the processes in the printing production system are ended.

The base material 15 is fed to a cleaning processing apparatus 200 via the base material transfer area 601. The cleaning processing apparatus 200 cleans the base material 15 fed thereto. Then, the base material 15 is transferred to the self-traveling robot 111 and fed to a reverse printing machine 300 which is the printing processing apparatus via the transport line 110. The reverse printing machine 300 performs reverse printing of the gate electrode on the base material 15 fed thereto. Then, the base material 15 is transferred to the self-traveling robot 111 and fed to a heating baking furnace 600 which is the processing apparatus via the transport line 110. The heating baking furnace 600 performs baking the gate electrode 22.

Next, the base material 15 is transferred to the self-traveling robot 111 and fed to an electrode cleaning machine 400 which is the processing apparatus via the transport line 110. The electrode cleaning machine 400 cleans the gate electrode 22. Then, the base material 15 is transferred to the self-traveling robot 111 and fed to a slit die coater 500 which is the processing apparatus via the transport line 110. The slit die coater 500 performs coating (printing) of the gate insulating layer 23 on the gate electrode 22. Then, the base material 15 is transferred to the self-traveling robot 111 and fed again to the heating baking furnace 600 which is the processing apparatus via the transport line 110. The heating baking furnace 600 performs baking the gate insulating layer 23.

Then, the base material 15 is transferred to the self-traveling robot 111 and fed again to the reverse printing machine 300 which is the processing apparatus via the transport line 110. The reverse printing machine 300 performs reverse printing of the source electrode 24 and the drain electrode 25 on the gate insulating layer 23. Then, the base material 15 is transferred to the self-traveling robot 111 and fed again to the heating baking furnace 600 which is the processing apparatus via the transport line 110. The heating baking furnace 600 performs baking the source electrode 24 and the drain electrode 25. Then, the base material 15 is transferred to the self-traveling robot 111 and fed again to the electrode cleaning machine 400 which is the processing apparatus via the transport line 110. The electrode cleaning machine 400 cleans the source electrode 24 and the drain electrode 25.

Next, the base material 15 is transferred to the self-traveling robot 111 and placed on the through loader 130 via the transport line 110. The base material 15 placed on the through loader 130 is transferred to the self-traveling robot 121 and put into the transport line 120.

The base material 15 transferred to the self-traveling robot 121 is fed to an inkjet printing machine 1000 which is the processing apparatus via the transport line 120. The inkjet printing machine 1000 performs inkjet printing of the organic semiconductor layer 26 between the source electrode 24 and the drain electrode 25. Then, the base material 15 is transferred to the self-traveling robot 121 and fed to a heating baking furnace 900 which is the processing apparatus via the transport line 120. The heating baking furnace 900 performs baking the organic semiconductor layer 26.

In this way, it is possible to form the organic thin-film transistor 20.

Then, the base material 15 is transferred to the self-traveling robot 121 and fed to a second screen printing machine 800 which is the processing apparatus via the transport line 120. The second screen printing machine 800 performs screen printing of the intermediate layer 27. Then, the base material 15 is transferred to the self-traveling robot 121 and fed again to the heating baking furnace 900 which is the processing apparatus via the transport line 120. The heating baking furnace 900 performs baking the intermediate layer 27. Next, the base material 15 is transferred to the self-traveling robot 121 and fed again to a first screen printing machine 700 which is the processing apparatus via the transport line 120. The first screen printing machine 700 performs screen printing of the pixel electrode 28 on the intermediate layer 27. Then, the base material 15 is transferred to the self-traveling robot 121 and fed again to the heating baking furnace 900 which is the processing apparatus via the transport line 120. The heating baking furnace 900 performs baking the pixel electrode 28.

In this way, it is possible to form the pixel driving element 29 having the organic thin-film transistor 20 as a driving element.

The base material 15 on which the pixel driving element 29 is formed is transferred to the self-traveling robot 121 and placed in the stock chamber 12 via the line 120. The placed base material 15 is taken out to the outside when necessary.

After the processes in the printing production system are ended, if the film base material is fixed to the supporting member, the film base material is detached from the supporting member, whereby an electronic device can be obtained.

It is desirable to subject the organic thin-film transistor (pixel driving element) array thus obtained to a defect inspection, short circuit repair, electrical characteristics measurement, and so forth as needed.

It is preferable that, as described above, the printing production system 1 is configured by combining a processing apparatus performing printing using plates (for example, the reverse printing machine 300, the slit die coater 500, the first screen printing machine 700, the second screen printing machine 800, and the like) and a processing apparatus performing printing using no plates (for example, the inkjet printing machine 1000 and the like). The reason is that, as a result of printing using plates which has enhanced processing efficiency and printing using no plates which has a high degree of flexibility being combined together, it is possible to produce a synergistic effect.

It is desirable to use printing using no plates in, in particular, processing in the latter part of the processes (in the above-described example, processing for forming the organic semiconductor layer). The reason is as follows. In the processing in the latter part of the processes, distortion easily occurs in the shape of the base material due to a load (such as heating with an oven) caused by the processing in the first part of the processes, and, if the base material is a film base material, the tendency is pronounced in the film base material. However, printing using no plates, in particular, inkjet printing can easily correct the printing position with consideration given to this distortion and achieve high-precision printing.

As in the above-described example, even when the film base material is subjected to processing in a state in which the film base material is bonded to the surface of the glass base material which is the supporting member, distortion of the film base material cannot be prevented completely, and, in particular, in production of an electronic device which is required to have a high degree of precision, even slight distortion cannot be ignored. Printing using no plates, in particular, inkjet printing can suitably cope with this problem.

Although the processes in the printing production system have been described above with attention given to one base material 15, it is preferable that the printing production system is configured so as to process a plurality of base materials concurrently.

For example, it is preferable that, while one processing is being performed on some of the base materials, another processing is concurrently performed on some of the other base materials.

Moreover, as in the above-described example, it is preferable that, in the printing production system, the base material is fed to the same processing apparatus more than once in some steps. From the processing apparatus's point of view, it is preferable that one processing apparatus processes a plurality of base materials in different steps at the same time.

The processing apparatuses provided in the processing chambers are not limited to the examples described above, and appropriate processing apparatuses can be chosen in accordance with an electronic device to be produced.

In the above description, an example of production of the pixel driving element 29 using the organic thin-film transistor 20 has been described. For example, when an organic EL display is produced, on the pixel electrode 28 of the pixel driving element 29, a hole transport layer, a light-emitting layer, and an electron transport layer can be further stacked by the printing method using the printing production system of the present invention. Moreover, as the organic thin-film transistor 20, a so-called bottom contact-bottom gate-type transistor is taken up as an example, but an organic thin-film transistor which is produced by the present invention is not limited thereto.

Examples of the configuration of an organic thin-film transistor which is produced by the present invention include (A) to (D) below.

(A) Bottom contact-bottom gate type (also called an inverted coplanar structure)

(B) Bottom contact-top gate type (also called a staggered structure)

(C) Top contact-bottom gate type (also called an inverted staggered structure)

(D) Top contact-top gate type (also called a coplanar structure)

Incidentally, a structure in which a gate electrode is located below an organic semiconductor layer is called a "bottom gate type". On the other hand, a structure in which an organic semiconductor layer is first formed on a base material and a gate insulating film and a gate electrode are sequentially disposed thereon is called a "top gate type". Likewise, a case where source and drain electrodes are disposed on the lower surface of an organic semiconductor layer is called a "bottom contact type", and a case where source and drain electrodes are disposed on the upper surface of an organic semiconductor layer is called a "top contact type". Combining these types makes it possible to obtain the above-described four types of structures.

Moreover, examples of the configuration of an organic thin-film transistor which is produced by the present invention further include a vertical structure in which source and drain electrodes are disposed vertically with an organic semiconductor layer sandwiched therebetween.

As described earlier, an organic thin-film transistor array (organic TFT array) in which a large number of organic thin-film transistors are arranged on a base material in a matrix is suitably used for pixel driving in an image display device, but applications thereof are not limited thereto. For example, an organic thin-film transistor array (organic TFT array) in which a large number of organic thin-film transistors are arranged on a base material in a matrix can also be suitably used as an active element of a sensor.

In the printing production system 1, as depicted in FIGS. 1 and 2, it is desirable that the processing apparatuses are provided at intervals. Doing so makes it easy to make changes such as adding a new processing apparatus and therefore makes it possible to deal with production of various electronic devices, in particular, various organic thin-film transistors described above with flexibility. Since there is yet room in the field of organic thin-film transistors which is still growing, the flexibility of the printing production system is of great significance.

The description given for one embodiment in the above descriptions is appropriately applied to other embodiments.

EXAMPLE

Hereinafter, the present invention will be further described by using an example of the present invention.

Production of an electronic device by printing was performed by using the system depicted in FIGS. 1 and 2.

<Experimental Conditions>

1. Transport Chamber
Shape: 22 mL×1.4 mW×2.2 mH
Floor area 30 m$^2$
Total capacity 70 m$^3$
16 clean units manufactured by AIRTECH JAPAN, Ltd. were installed in a ceiling portion. Clean air was sent from the ceiling and blown downward in the transport chamber.

2. Base Material Transfer Area
Shape: depth 0.5 m

3. Processing Chamber and Processing Apparatus
The processing chambers depicted in FIGS. 1 and 2, the processing chambers based on the example of production of the organic thin-film transistor (pixel driving element) array depicted in FIG. 7, were provided.

In a ceiling portion of each processing chamber, a clean units manufactured by AIRTECH JAPAN, Ltd. were provided.

4. Checking of an Air Flow in an Opening
One end of a thin string was fixed in a predetermined position of an opening of 500 mm×15 mm shape. If there is no air flow, the string remains hanging; if an air flow is generated, the string flies horizontally.

It was checked whether the string flew toward the base material transfer area from the transport chamber or flew toward the transport chamber from the base material transfer area.

If the string flies toward the base material transfer area from the transport chamber, since the air flow moves toward the base material transfer area from the transport chamber, this is the embodiment of the present invention.

<Evaluation>

The string provided in the opening flew toward the base material transfer area from the transport chamber. It was confirmed that the air flow moved toward the base material transfer area from the transport chamber.

Ten samples of pixel driving elements, each having the produced organic thin-film transistor as a driving element, were prepared, and there were no defective products caused by dust generated by the printing method.

EXPLANATIONS OF LETTERS OR NUMERALS

1: transport chamber
100: robot transport line
101: air supply port
102: fan
103: filter
104: clean unit
105: air supply pipe
106: wall parallel downward flow
107: straightening vane
108: exhaust slot
110, 120: transport line
112, 122: guide rail
111, 121: self-traveling robot
113, 114: arm
115: suction mechanism
116: housing portion
130: through loader
601: base material transfer area
602: opening
603: transport conveyor
630: air supply port
640: air supply port
631: fan
632: filter
633: air supply unit
201, 301, 401, 501, 701, 801, 901, and 1001: base material transfer area
202, 302, 402, 502, 702, 802, 902, and 1002: opening
6: processing chamber
600: processing apparatus, heating processing apparatus
641: fan
642: filter
643: air supply unit
644: clean air piping
650: exhaust port
2, 3, 4, 5, 7, 8, 9, 10: processing chamber
200: processing apparatus, cleaning processing apparatus
300: processing apparatus, printing processing apparatus
400: processing apparatus, cleaning processing apparatus
500: processing apparatus, printing processing apparatus
700: processing apparatus, printing processing apparatus
800: processing apparatus, printing processing apparatus
900: processing apparatus, heating processing apparatus
1000: processing apparatus, printing processing apparatus
11, 12: stock chamber
14: clean room
15: base material
20: organic thin-film transistor
22: gate electrode
23: gate insulating layer
24: source electrode
25: drain electrode
26: organic semiconductor layer
27: intermediate layer
28: electrode (pixel electrode)
29: pixel driving element

The invention claimed is:
1. A printing production system for an electronic device, wherein a transport chamber provided with a robot transport line in which a self-traveling robot that transports a base material in a sheet-fed manner in a free state travels is provided, a plurality of processing chambers for forming the electronic device on the base material by printing are provided on at least one side of the transport chamber, a plurality of base material transfer areas, each of the base material transfer areas performs loading of the base material to a respective processing chamber of the processing chambers from the self-traveling robot and unloading of the base material to the self-traveling robot from the respective processing chamber, the transport chamber and each of the base material transfer areas communicate with each other through respective openings that allow loading and unloading of the base material to be performed, a one-way air flow is formed in each of the respective openings moving to a side where the respective processing chamber is located from a side where the transport chamber is located, and the one-way air flow in the each of the respective openings is formed by making an adjustment such that an air pressure in the transport chamber becomes higher than an air pressure in each of the base material transfer areas, wherein an air pressure $P_1$ in the clean room, an air pressure $P_2$ in the base material transfer areas, and an air pressure $P_3$ in the transport chamber satisfy a relationship: $P_1 < P_2 < P_3$.

2. The printing production system for an electronic device according to claim 1, wherein the each of the respective openings has a minimum opening area that allows loading and unloading of the base material to be performed.

3. The printing production system for an electronic device according to claim 1, comprising:

a plurality of air supply ports in an upper part of the transport chamber, wherein each air supply port is provided with a clean unit formed of a fan and a filter.

4. The printing production system for an electronic device according to claim 1, comprising:

a straightening vane below a clean unit, the straightening vane for forming a wall parallel downward flow of clean air in the transport chamber.

5. The printing production system for an electronic device according to claim 4, wherein the straightening vane is an inclined plate that spreads in a shape of an inverted V toward two wall surfaces of the transport chamber when viewed from a longitudinal direction of the transport chamber.

6. The printing production system for an electronic device according to claim 1, wherein in an upper part of the each of the base material transfer areas or in each of the upper part of the each of the base material transfer areas and an upper part of the respective processing chamber, an air supply port that supplies clean air is provided.

7. The printing production system for an electronic device according to claim 1, wherein an exhaust port is provided in the each of the processing chambers.

8. The printing production system for an electronic device according to claim 1, wherein the robot transport line is provided linearly in a longitudinal direction on a floor surface of the transport chamber.

9. The printing production system for an electronic device according to claim 1, wherein in each of the processing chambers, a processing apparatus is provided, and the processing apparatus including a cleaning apparatus, a printing apparatus, and a heating processing apparatus.

10. The printing production system for an electronic device according to claim 1, wherein the base material is a film base material.

11. The printing production system for an electronic device according to claim 1, wherein the transport chamber, a plurality of base material transfer areas, and the plurality of processing chambers, each being provided so as to connect to a corresponding one of the plurality of base material transfer areas, are housed in a clean room, and the transport chamber, the plurality of base material transfer areas, the plurality of processing chambers, and the clean room conform to FED-STD-209E for air cleanliness, wherein air cleanliness of the clean room is kept at Class 1000, air cleanliness of all the base material transfer areas and the plurality of processing chambers, each being provided so as to connect to a corresponding one of the plurality of base material transfer areas, is kept at Class 100, and air cleanliness of the transport chamber is kept at Class 10.

* * * * *